United States Patent
Wangler et al.

(10) Patent No.: US 8,294,877 B2
(45) Date of Patent: Oct. 23, 2012

(54) ILLUMINATION OPTICAL UNIT FOR PROJECTION LITHOGRAPHY

(75) Inventors: Johannes Wangler, Koenigsbronn (DE); Markus Deguenther, Aalen (DE); Stig Bieling, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/368,430

(22) Filed: Feb. 8, 2012

(65) Prior Publication Data
US 2012/0206704 A1    Aug. 16, 2012

Related U.S. Application Data (60) Provisional application No. 61/441,328, filed on Feb. 10, 2011.

(30) Foreign Application Priority Data

Feb. 10, 2011 (DE) .......... 10 2011 003 928

(51) Int. Cl.
G03B 27/54 (2006.01)
G03B 27/42 (2006.01)
(52) U.S. Cl. .......... 355/67; 355/53
(58) Field of Classification Search .......... 355/67, 355/53, 66
See application file for complete search history.

(56) References Cited

U.S. PATENT DOCUMENTS

| 6,195,201 B1 | 2/2001 | Koch et al. |
| 2004/0065817 A1 | 4/2004 | Singer et al. |
| 2011/0001947 A1 | 1/2011 | Dinger et al. |
| 2011/0019172 A1 | 1/2011 | Hoegele et al. |

FOREIGN PATENT DOCUMENTS

| EP | 1 225 481 | 7/2002 |
| WO | WO 2009/095052 | 8/2009 |
| WO | WO 2010/049076 | 5/2010 |

OTHER PUBLICATIONS

Choksi, N. et al.: "Maskless extreme ultraviolet lithography", J. Vac. Sci. Technol. B 17 (6), 1999.
German Examination report, with English translation, for corresponding DE Appl No. 10 2011 003 928.7, dated Sep. 6, 2011.

*Primary Examiner* — Peter B Kim
(74) *Attorney, Agent, or Firm* — Fish & Richardson P.C.

(57) ABSTRACT

An illumination optical unit for projection lithography for illuminating an object field, in which an object to be imaged can be arranged, with illumination light has a field facet mirror having a plurality of field facets. A pupil facet mirror of the illumination optical unit has a plurality of pupil facets. The pupil facets serve for imaging the field facets respectively assigned individually to the pupil facets into the object field. An individual mirror array of the illumination optical unit has individual mirrors that can be tilted in driven fashion individually. The individual mirror array is arranged in an illumination light beam path upstream of the field facet mirror. This can result in flexibly configurable illumination by the illumination optical unit, this illumination being readily adaptable to predetermined values.

15 Claims, 6 Drawing Sheets

Fig. 16

ILLUMINATION OPTICAL UNIT FOR PROJECTION LITHOGRAPHY

CROSS-REFERENCE TO RELATED APPLICATIONS

This application claims benefit under 35 U.S.C. §119 to German Application No. 10 2011 003 928.7, filed Feb. 10, 2011 and under 35 USC 119(e) of Provisional Application No. 61/441,328, filed Feb. 10, 2011.

The contents of German patent application DE 10 2011 003 928.7 is incorporated by reference.

BACKGROUND

The disclosure relates to an illumination optical unit for projection lithography for illuminating an object field, in which an object to be imaged can be arranged, with illumination light. Furthermore, the disclosure relates to an illumination system including an illumination optical unit of this type, a projection exposure apparatus including an illumination system of this type, a production method for producing a micro- or nanostructured component using such a projection exposure apparatus, and a micro- or nanostructured component produced by such a production method.

Illumination optical units are disclosed, for example in WO 2010/049076 A2 and WO 2009/095052 A1.

SUMMARY

A problem addressed by the present disclosure is that of making the illumination of the object to be imaged flexible and readily adaptable to predetermined values.

In certain aspects, this problem is solved using the illumination optical units disclosed herein.

An individual mirror array arranged upstream of the field facet mirror can yield new degrees of freedom in the design of the object field illumination. The individual mirror array can be embodied as a multi- or micromirror array and can be embodied, in particular, as a microelectromechanical system (MEMS). The facets of the field facet mirror and/or the facets of the pupil facet mirror can be embodied as rigid facets, that is to say facets that cannot be tilted between different tilting positions. The field facets can image the individual mirrors of the individual mirror arrays onto assigned pupil facets. The field facets of the field facet mirror can be arranged in non-continuous facet regions, between which interspaces are present. The individual facet regions separated from one another can be arranged with a greater number of degrees of freedom with respect to one another. A non-continuous arrangement of facet regions can be used particularly when a beam path of the illumination light upstream of the field facet mirror is already split into different partial beams. The field facets of the field facet mirror can be arranged in their entirety such that they are reached by the individual mirrors of the individual mirror array with tilting positions of the individual mirrors with small absolute tilting angles. Field facets which image a group of individual mirrors onto different pupil facets can be arranged such that a tilting angle necessary for the individual mirrors for attaining such an illumination geometry, in order that the illumination light reaches the desired field facets, is attained as rapidly as possible in each case.

The pupil facets of the pupil facet mirror can be arranged in a hexagonally densest packing, can be arranged in a Cartesian arrangement, that is to say in rows and columns, or can also be arranged rotationally symmetrically. The arrangement of the pupil facets can be deformed, for example in order to correct distortion effects.

Certain disclosed embodiments may be particularly suitable for attaining an illumination flexibility.

In some embodiments, illumination optical units may be highly suitable for correcting an intensity distribution over the object field (uniformity correction). A definition of uniformity can be found in WO 2009/095052 A1.

In some embodiments, illumination optical units allow, in particular, the setting of an illumination angle distribution of an illumination of the object that is dependent on the location on the object field. This can be used for demanding imaging requirements.

Designs of the illumination beam path may be particularly suitable for the assignment of the individual mirrors of the individual mirror array to the field facets. Using such designs, it is possible to predetermine a dependence of an intensity profile of an intensity of the illumination light along a predetermined direction, for example perpendicularly to a movement direction of the object to be imaged during projection exposure. This can be used for correcting the intensity profile.

In certain embodiments, angles of incidence (e.g., grazing incidence) allow reflection at the individual mirror array with particularly low illumination light losses. The arrangement can be such that the individual mirrors are illuminated at an angle of incidence that is greater than 65° or greater than 70°. Alternatively, the illumination optical unit can be arranged such that the individual mirrors are illuminated at an angle of incidence that lies in the range of perpendicular incidence.

Fitting the individual mirrors on a curved baseplate can lead to the possibility of arranging the individual mirrors such that they reflect a radiation beam impinging divergently on the individual mirror array with identical angles of incidence. The curvature can be chosen such that upon the setting of the individual mirrors in the neutral position, the result is a shape of the EUV radiation beam reflected from the individual mirror array which corresponds to a desired beam shape. This shape can correspond, in particular, to the configuration of the arrangement of the entirety of the field facets of the field facet mirror. A desired intensity profile within the EUV radiation beam after reflection at the individual mirror array can also be attained using a corresponding curvature of the baseplate of the individual mirror array. Alternatively, the individual mirror array can have a planar baseplate.

In some embodiments, a design of a drivable tilting range enables, proceeding from the neutral position, the individual mirrors to be tilted over a wide tilting range in a preferred tilting direction. Said tilting range can sweep over a tilting angle of 20°, for example.

A subdivision of the individual mirror array can enable the reflection of an EUV radiation beam of a large divergence angle, that is to say with a large numerical aperture. The individual mirror array can be subdivided into two sections. A larger number of such sections is also possible. The individual mirror array subdivided into sections can have nested construction, such as is known in the case of Wolter optics, for example, and is used particularly in the case of EUV collectors in EUV projection lithography.

An assignment of pupil facet regions to field facet regions may make it possible to optimize the system efficiency or the reflection efficiency of the illumination optical unit and thus to optimize the throughput of used light. The continuous pupil facet regions can be chosen such that predetermined illumination settings, for example polar illumination settings such as dipole or multipole illumination settings, annular illumination settings or conventional illumination settings with a predetermined maximum illumination angle can be established therefrom. Such illumination settings are known from WO 2009/095 052 A1, for example. The continuous pupil facet regions can be chosen such that illumination settings with the highest possible energy efficiency, that is to say with the best possible illumination light throughput of the illumination optical unit, can be predetermined.

The continuous pupil facet regions can be embodied as sectors on the pupil facet mirror. The continuous field facet regions can be embodied as columns of a field facet mirror having an arrangement of the field facets in rows and columns. A field facet row position in a field facet mirror having continuous field facet regions arranged in this way can be a measure of a radial position of the assigned pupil facet of the pupil facet region.

Embodiments may include an illumination system, a projection exposure apparatus, a production method and/or of a micro- or nanostructured component that feature or utilize the optical units according to the disclosure. An EUV radiation source can be used as a radiation source for the projection exposure apparatus.

BRIEF DESCRIPTION OF THE DRAWINGS

Exemplary embodiments are explained in greater detail below with reference to the drawing, in which.

DETAILED DESCRIPTION

Figure 1:
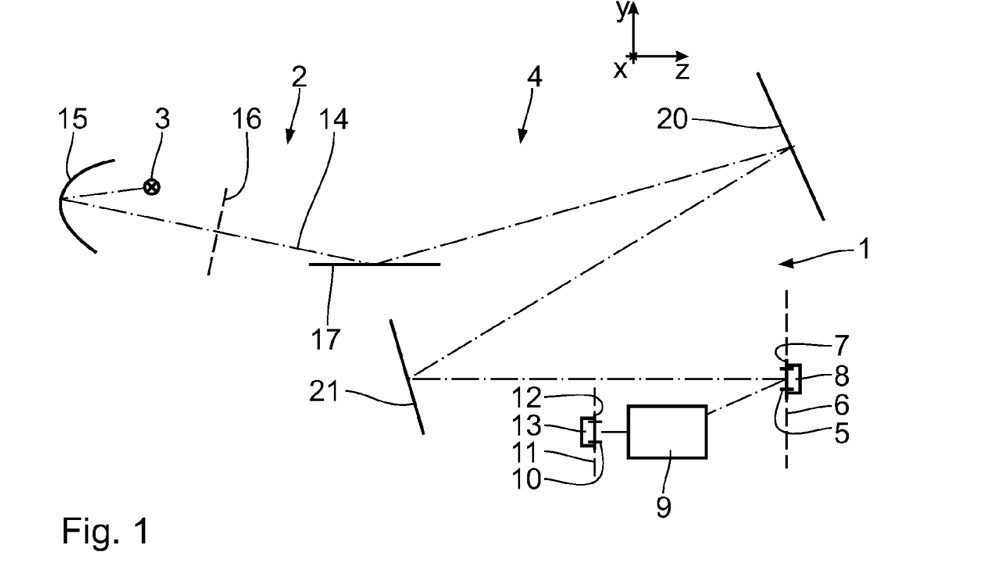
FIG. 1 shows schematically a projection exposure apparatus for microlithography with an illumination optical unit illustrated in the meridional section, and with a projection optical unit.

FIG. 1 shows schematically in a meridional section a projection exposure apparatus 1 for microlithography. An illumination system 2 of the projection exposure apparatus 1 has, besides a radiation source 3, an illumination optical unit 4 for exposing an object field 5 in an object plane 6.

In order to simplify an explanation of positional relationships, in the drawing a Cartesian xyz coordinate system is used hereafter. An x-axis runs perpendicularly to the plane of the drawing in FIG. 1 into the latter. A y-axis runs upwards in FIG. 1. A z-axis runs towards the right in FIG. 1. The x-axis runs perpendicularly to the object plane 6.

A local Cartesian xyz coordinate system is depicted in selected figures from among the figures below, wherein the x-axis runs parallel to the x-axis according to FIG. 1 and the y-axis spans with said x-axis the optical area of the respective optical element. In part, the optical area of the respective optical element is also spanned parallel to the xz plane.

The object field 5 can be configured in rectangular or arcuate fashion with an x/y aspect ratio of 13/1, for example. In this case, a reflective reticle 7 arranged in the object field 5 is exposed, said reticle bearing a structure that is to be projected using the projection exposure apparatus 1 for producing micro- or nanostructured semiconductor components. The reticle 7 is carried by a reticle holder 8, which can be moved in driven fashion in the y-direction. A projection optical unit 9 serves for imaging the object field 5 into an image field 10 in an image plane 11. The structure on the reticle 7 is imaged onto a light-sensitive layer of a wafer 12 arranged in the region of the image field 10 in the image plane 11. The wafer 12 is carried by a wafer holder 13, which is moved in driven fashion in the y-direction synchronously with the reticle holder 8 during projection exposure.

During the operation of the projection exposure apparatus 1, the reticle 7 and the wafer 12 are scanned synchronously in the y-direction. Depending on the imaging scale of the projection optical unit 9, it is also possible for the reticle 7 to be scanned in an opposite direction relative to the wafer 12.

The radiation source 3 is an EUV radiation source having an emitted used radiation in the range of between 5 nm and 30 nm. This can be a plasma source, for example a GDPP source (gas discharge produced plasma), or an LPP source (laser produced plasma). Other EUV radiation sources, for example those based on a synchrotron or on a free electron laser (FEL), are also possible.

An EUV radiation beam 14, which emerges from the radiation source 3 and is indicated by a dashed-dotted chief ray in FIG. 1, is concentrated by a collector 15. A corresponding collector is known from EP 1 225 481 A, for example. Downstream of the collector 15, the EUV radiation beam 14 propagates through an intermediate focal plane 16 before impinging on an individual mirror array 17. In variants of the guidance of the EUV radiation beam 14 which are likewise possible, one intermediate focus is present or a plurality of intermediate foci are present. The individual mirror array 17 is embodied as a microelectromechanical system (MEMS). It has a multiplicity of individual mirrors 18 arranged in matrix-like fashion in rows and columns in an array, which are illustrated schematically in FIGS. 8 to 11. The individual mirrors 18 can have square or rectangular reflection surfaces. These reflection surfaces lie approximately in a plane that runs with respect to the xz plane of the global xyz coordinate system according to FIG. 1. The individual mirrors 18 are in each case connected to actuators 19 and designed to be tiltable about two axes perpendicular to one another in the reflection plane of the respective individual mirror 18. Overall, the individual mirror array 17 has approximately 100 000 of the individual mirrors 18. Depending on the size of the individual mirrors 18, the individual mirror array can also have for example 1000, 5000, 7000 or even hundreds of thousands of, for example 500 000, individual mirrors 18. The individual mirrors 18 can have a highly reflective multilayer optimized for the respective angle of incidence and the wavelength of the EUV used light.

A spectral filter can be arranged upstream of the individual mirror array 17, said spectral filter separating the used EUV radiation beam 14 from other wavelength components of the emission of the radiation source 3 that are not usable for the projection exposure. The spectral filter is not illustrated. Downstream of the individual mirror array 17, the EUV radiation beam 14 impinges on a field facet mirror 20. The field facet mirror 20 is arranged in a plane of the illumination optical unit 4 that is optically conjugate with respect to the object plane 6.

The EUV radiation beam 14 is also designated hereinafter as used radiation, illumination light, or as imaging light.

Downstream of the field facet mirror 20, the EUV radiation beam 14 is reflected from a pupil facet mirror 21. The pupil facet mirror 21 lies either in the entrance pupil plane of the illumination optical unit 4 or in a plane that is optically conjugate with respect thereto. The field facet mirror 20 and the pupil facet mirror 21 are in each case constructed from a multiplicity of facets, which are also designated as fly's eye cells and are described in even greater detail below. In this case, the subdivision of the field facet mirror 20 can be such that each of the field facets 22 (cf. FIGS. 3, 5 and 13) which per se illuminate the entire object field 5 is represented by exactly one individual mirror. Alternatively, it is possible for at least some or all of the field facets to be constructed using a plurality of mirrors. The same correspondingly applies to the configuration of the pupil facets 23 (cf. FIGS. 4, 6 and 13) of the pupil facet mirror which are respectively assigned to the field facets and which can be formed in each case by an individual mirror or by a plurality of mirrors.

The EUV radiation beam 14 impinges on the individual mirror array 17 at an angle of incidence that is greater than 70° (grazing incidence) and can be greater than 75°, and impinges on the two facet mirrors 20, 21 at an angle of incidence that is less than or equal to 25°. Therefore, the EUV radiation 10 is applied to the two facet mirrors in the range of normal-incidence operation. Application with grazing incidence is also possible. The pupil facet mirror 21 is arranged in a plane of the illumination optical unit 4 that constitutes a pupil plane of the projection optical unit 9 or is optically conjugate with respect to a pupil plane of the projection optical unit 9. With the aid of the pupil facet mirror 21 and, if appropriate, a downstream imaging optical assembly (not illustrated in the drawing) in the form of a transfer optical unit, the field facets 22 of the field facet mirror 20 are imaged into the object field 5 in a manner being superimposed on one another.

The individual mirror array 17 is arranged in the beam path of the EUV radiation beam 14, that is to say in an illumination light beam path, upstream of the field facet mirror 20.

The field facets 22 of the field facet mirror 20 image the individual mirror array 17 in sections onto the pupil facet mirror 21. In this case, various illumination situations are possible, which are explained below with reference to FIGS. 3 to 6 and 13.

Figure 3:
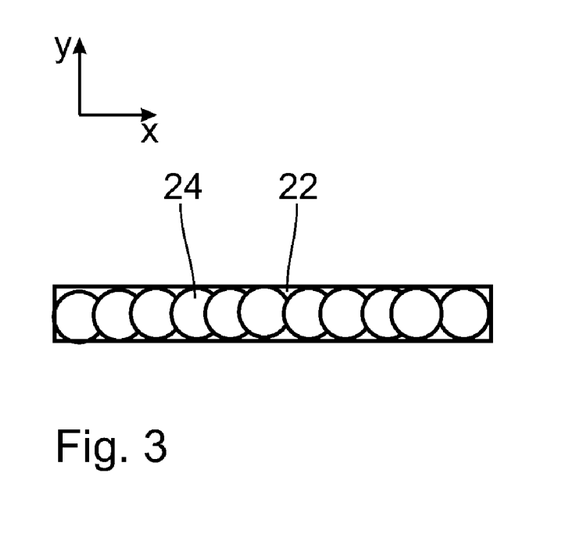
FIG. 3 shows schematically an illumination of one of the field facets of the field facet mirror in the case of a first of the illumination situations according to FIG. 2.
Figure 4:
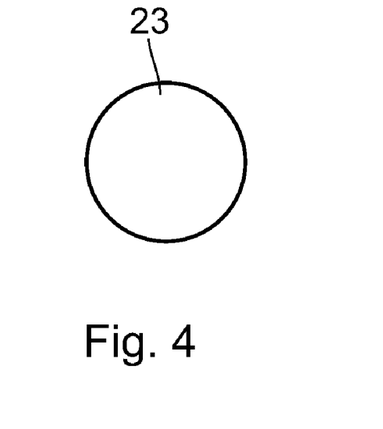
FIG. 4 shows an illumination of one of the pupil facets in the case of the first illumination situation according to FIG. 2.

In the illumination situation according to FIGS. 3 and 4, individual mirror partial beams 24 of the EUV radiation beam 14 which are reflected from specific mirrors from among the individual mirrors 18 of the individual mirror array 17 are incident on exactly one of the field facets 22.

FIG. 3 shows the plan view of exactly one of the field facets 22. The field facets 22 of the field facet mirror 20 have an x/y aspect ratio corresponding to the x/y aspect ratio of the object field 5. The field facets 22 therefore have an x/y aspect ratio that is greater than 1. A long facet side of the field facets 22 runs in the x-direction. A short facet side of the field facets 22 runs in the y-direction.

Overall, eleven individual mirror partial beams 24 are applied to the field facet 22 in the case of the illumination situation according to FIG. 3. The individual mirror partial beams 24 are applied to the field facet 22 in a series lined up along the x-axis, wherein the individual mirror partial beams partly overlap one another in the x-direction, such that EUV light is continuously applied to the field facet 22 in the x-direction. The individual mirror partial beams 24 have a diameter that corresponds approximately to the y-extent of the field facet 22. A larger number of individual mirror partial beams 24 which are applied to the field facet 22 in order in a manner overlapping one another, for example 15 individual mirror partial beams 24, 20 individual mirror partial beams 24, 25 individual mirror partial beams 24 or an even greater number of individual mirror partial beams 24, is also possible.

The field facet 22 according to FIG. 3 images the individual mirrors 18, from which the individual mirror partial beams 24 that are applied to the field facet 22 emerge, onto the pupil facet 23 (illustrated in FIG. 4) alongside one another. An excerpt from the individual mirror array 17 is imaged onto the assigned pupil facet 23 using the field facet 22. The images of the individual mirrors 18 do not overlap on the pupil facet 23, but rather are arranged alongside one another. The location of the pupil facet 23 on the pupil facet mirror 21 predetermines an illumination direction or an illumination angle for the illumination of the reticle 7.

In the case of the illumination situation according to FIGS. 3 and 4, therefore, a group of, for example, eleven individual mirrors 18 of the individual mirror array 17 is imaged onto exactly one pupil facet 23. Such a group of individual mirrors 18 which are imaged onto a single pupil facet 23 can also contain different numbers of individual mirrors, for example two to 50 individual mirrors with associated individual mirror partial beams 24.

Figure 5:
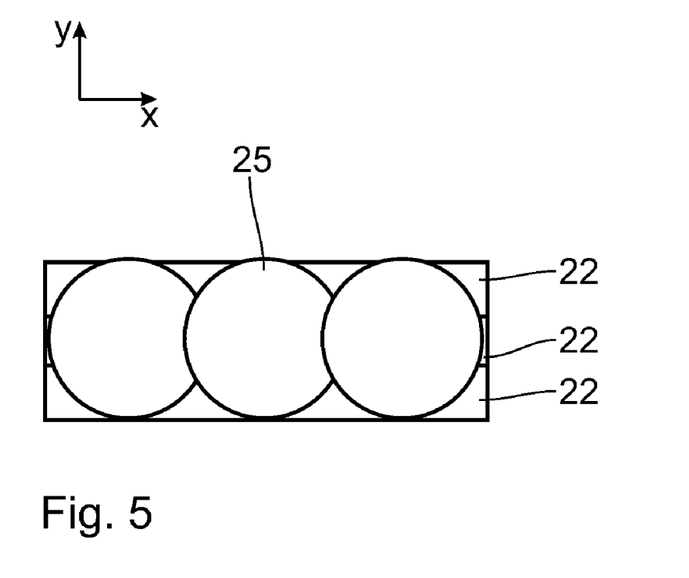
FIG. 5 shows an illumination of the assigned field facets in a second illumination situation, in which partial beams of the illumination are so large that they are reflected in sections by a plurality of adjacent field facets.
Figure 6:
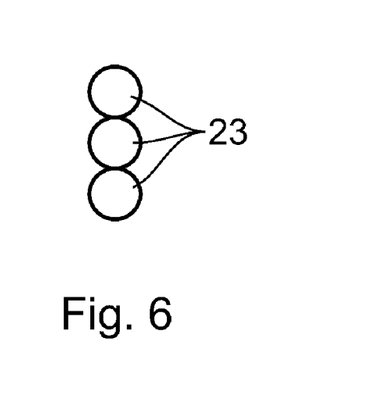
FIG. 6 shows an illumination of the pupil facets in the case of the illumination situation according to FIG. 5.

In the case of the illumination situation according to FIGS. 5 and 6, individual mirror partial beams 25 have a y-extent that is approximately 3 times as large as the y-extent of the field facets 22. A respective one of the individual mirror partial beams 25 can therefore cover three adjacent field facets 22 in the y-direction.

The three field facets 22 image the individual mirrors that reflect the individual mirror partial beams 25 into three pupil facets 23 lying one above another, which are illustrated in FIG. 6.

In the case of the illumination situations according to FIGS. 3 and 5, the individual mirror partial beams 24, 25, that is to say illumination spots of specific individual mirrors 18, overlap on the field facet mirror 20.

Figure 2:
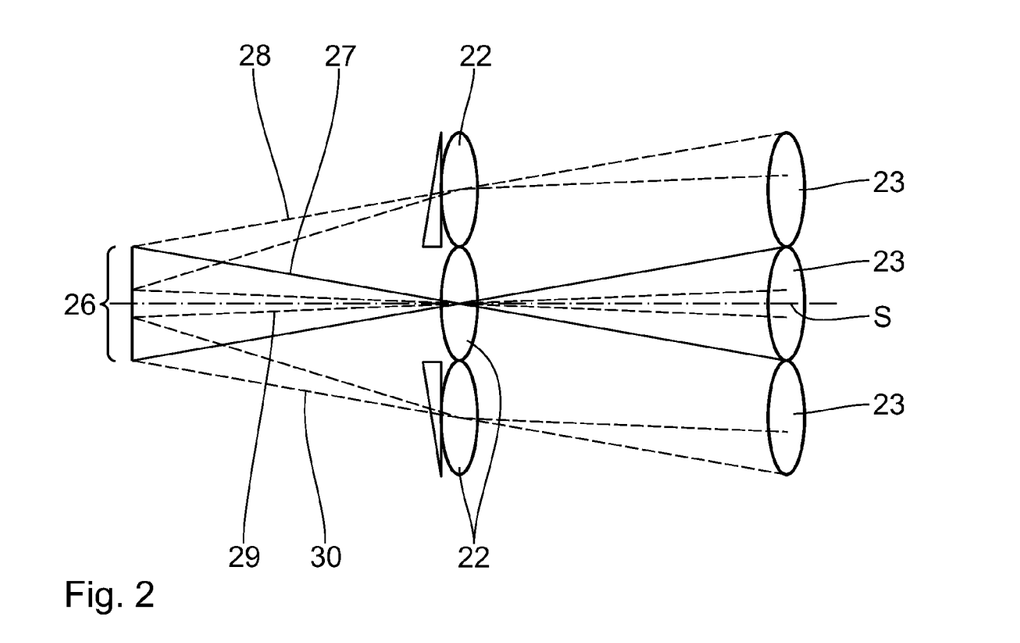
FIG. 2 shows schematically and for illustration reasons in transmission imaging relations between a section of an individual mirror array, assigned field facets of a field facet mirror and assigned pupil facets of a pupil facet mirror of the illumination optical unit according to FIG. 1 for two different illumination situations that can be set using a corresponding tilting of individual mirrors of the individual mirror array.

FIG. 2 shows, with a solid beam path, an illumination situation corresponding to that according to FIGS. 3 and 4.

FIG. 2 shows the imaging relations in transmission for the sake of better comprehensibility. An individual mirror group beam 27 emerges from a section of the individual mirror array 17 with a group 26 of individual mirrors 18 (not illustrated individually in FIG. 2), said individual mirror group beam being imaged onto the middle pupil facet 23 in FIG. 2 by the middle field facet 22 in FIG. 2. The individual mirror group beam 27 can be understood as a combination of the individual mirror partial beams 24 according to FIG. 3.

FIG. 2 illustrates by dashed lines the situation wherein, using actuator-driven tilting of the individual mirrors 18 of the group 26, the light emerging from said group is split into three individual mirror subgroup beams 28, 29, 30, which are applied to three mutually adjacent field facets 22 of the field facet mirror 20.

In this case, the middle individual mirror subgroup beam 29 has the same path as in the illumination situation explained first in connection with FIG. 2. Therefore, the associated individual mirrors 18 did not have to be rearranged. This individual mirror subgroup beam 29 is therefore again imaged onto the middle pupil facet 23 in FIG. 2 by the middle field facet 22 in FIG. 2. The upper individual mirror subgroup beam 28 in FIG. 2 is imaged onto the pupil facet 23 illustrated at the top in FIG. 2 by the field facet 22 illustrated at the top in FIG. 2. A wedge effect of this upper field facet 22 is indicated by a wedge in FIG. 2. This is not a real optical wedge, but rather only an illustration of the wedge effect, which causes the upper individual mirror subgroup beams 28 not to be applied centrally to the upper pupil facet 23 in FIG. 2, but rather in the upper section in FIG. 2. The individual mirror subgroup beam 30 runs mirror-symmetrically with respect to the individual mirror subgroup beam 28 about a plane of symmetry S running perpendicularly to the plane of the drawing in FIG. 2. The correspondingly opposite wedge effect of the lower field facet 22 in FIG. 2 is also indicated again by a wedge.

In the case of the illumination situation according to FIG. 2, therefore, an arrangement is present in such a way that the group 26 having a plurality of individual mirrors 18 which can be imaged in its entirety onto one of the pupil facets 23, namely the middle pupil facet 23 in FIG. 2, is imaged onto a plurality of pupil facets 23, namely the three pupil facets 23 illustrated in FIG. 2, by corresponding tilting of at least some of the individual mirrors 18 of the group 26.

Figure 13:
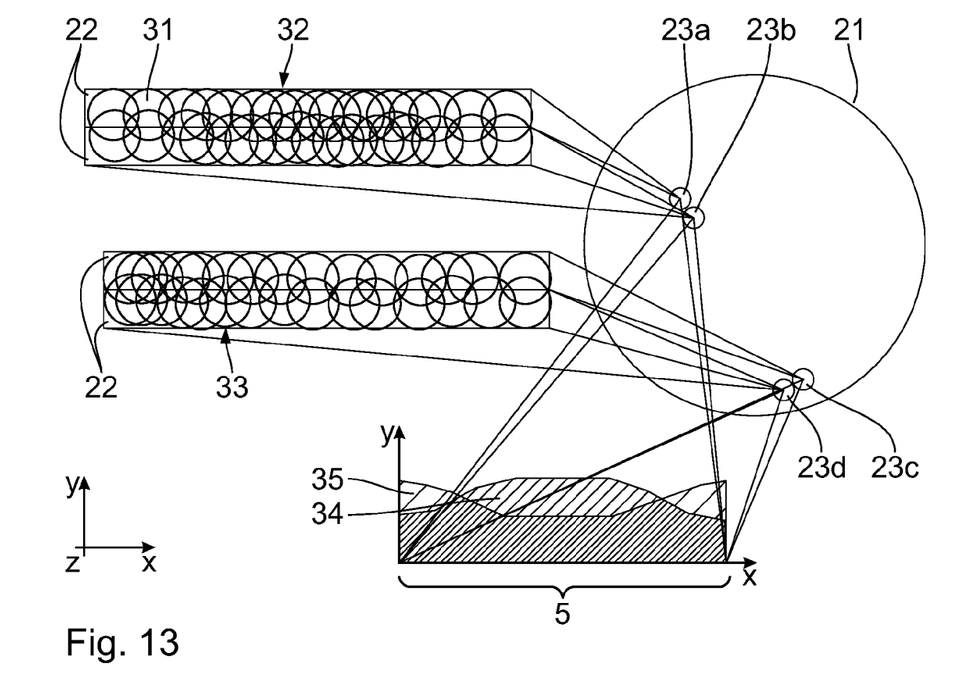
FIG. 13 shows by way of example, in an illustration similar to FIGS. 3 and 5, once again an illumination of two groups of two including field facets with individual mirror groups and subsequent imaging of the individual mirror groups onto assigned pupil facets, together with an intensity distribution assigned to the illuminated pupil facets in an object plane transversely with respect to a movement direction of an object to be imaged during the projection exposure.

FIG. 13 shows a further illumination situation, wherein individual mirror partial beams 31 have a y-extent amounting to approximately 1.3 times a y-extent of the field facets 22 of the field facet mirror 20. Two blocks 32, 33 of the field facets 22, which blocks respectively lie one above the other and are combined in this way to form a field facet block, are illuminated by two series of the individual mirror partial beams 31, wherein the individual mirror partial beams overlap both in the x-direction and in the y-direction. The two field facets 22 respectively combined to form a block 32, 33 are practically completely illuminated by two series of the individual mirror partial beams 31 that run in the x-direction and lie one above the other in the y-direction. The degree of overlap of this illumination with the individual mirror partial beams 31 has a different profile along the x-direction in the case of the upper block 32 composed of two field facets 22 compared with the block composed of two field facets 22 illustrated at the bottom in FIG. 13. In the case of the upper block 32, the individual mirror partial beams 31 overlap to a greater extent in the case of medium x-values along the field facets than in the case of small x-values and in the case of large x-values. An intensity profile 34, illustrated at the bottom in FIG. 13, results on account of the imaging of the field facets 22 of the block 32 into the object field 5 in the x-direction, that is to say perpendicularly to the scanning direction.

In the case of the field facet block 33, the individual mirror partial beams 31 overlap to a greater extent in the case of small x-values and in the case of large x-values than in the case of medium x-values. An intensity profile 35, likewise illustrated at the bottom in FIG. 13, arises over the object field 5 in the x-direction.

The two field facets 22 of the field facet block 32 are imaged into the object field 5 using two pupil facets 23a, 23b assigned to said field facets 22. The two field facets 22 of the field facet block 33 are likewise imaged into the object field 5 using two further pupil facets 23c, 23d. The two pupil facets 23a, 23b, on the one hand, and the two pupil facets 23c, 23d, on the other hand, are respectively directly adjacent to one another.

By predetermining a corresponding degree of overlap of the individual mirror partial beams 31 on the field facets 22 or the field facet blocks 32, 33, a dependence of the intensity profile in the x-direction (cf. e.g. intensity profiles 34, 35 in FIG. 13) can be individually predetermined for each illumination channel defined by one of the field facets 22 and the pupil facet 23 assigned to said field facet in the illumination light beam path towards the object field 5. As a result, this x-dependence can be adapted to a predetermined value.

Figure 14:
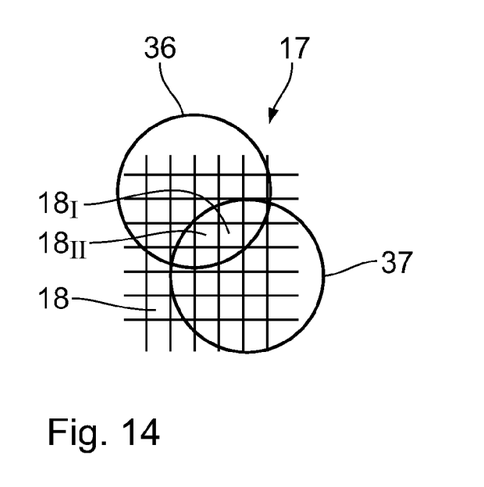
FIG. 14 shows a plan view of an excerpt from the individual mirror array.

The design of the illumination beam path can be such that groups of a plurality of the individual mirrors 18 which can be imaged in each case onto a specific one of the pupil facets 23 overlap one another on the individual mirror array 17, such that specific other individual mirrors 18 belong to a plurality of groups, that is to say can be imaged onto a plurality of pupil facets 23. This will be explained in greater detail below with reference to schematic FIG. 14. The latter shows an excerpt from the individual mirror array 17 having the individual mirrors 18 arranged in rows and columns in a grid-like manner. Within regions delimited by two circular lines in FIG. 14, two individual mirror groups 36, 37 lie on the individual mirror array 17. The individual mirrors 18 within the individual mirror group 36 can all be imaged onto one of the pupil facets 23, for example onto the pupil facet 23a in FIG. 13. The individual mirrors 18 of the individual mirror group 37 can all be imaged onto another of the pupil facets 23, that is to say for example onto the pupil facet 23b in FIG. 13. Specific mirrors from among the individual mirrors 18, namely the individual mirrors $18_I$ and $18_{II}$, inter alia, belong to both of these groups 36, 37. The individual mirrors $18_I$ and $18_{II}$ can therefore optionally be imaged onto the pupil facet 23a or onto the pupil facet 23b. The field facets 22 or the field facet blocks 32, 33 which realize this imaging can be adjacent to one another. In this case, the individual mirrors $18_I$ and $18_{II}$ for illumination can be directed at a boundary present between the adjacent field facets, since, irrespective of which of the two field facets 22 adjoining one another is illuminated, imaging onto one of the two desired pupil facets 23a, 23b is always effected. In this case, the individual mirror partial beams 25 can be positioned onto the field facets 22 in the region of the neighborhood boundary within maintaining a distance with respect to the adjoining field facet edge. This increases the system efficiency. Depending on the tilting of the individual mirrors $18_I$ and $18_I$, it is possible to select that pupil facet 23 onto which the respective individual mirror partial beam is directed. An intensity redistribution between different pupil facets can be performed in this way.

The individual mirror partial beams 25 and the individual mirror partial beams 31, which are also designated as illumination spots, have on the field facets 22 an extent along the short facet side that is larger than the short facet side. In the case of the illumination situation according to FIG. 5, this extent ratio is approximately 3. In the case of the illumination situation according to FIG. 13, the extent ratio is approximately 1.3. The extent ratio can be in a range of between 1.1 and 5.

The individual mirror partial beams 24, 25 and 31 have on the field facets an extent along the long facet side, that is to say a y-extent, that is smaller than the long facet side. This x-extent of the individual mirror partial beams 24, 25, 31 can be smaller than the x-extent of the field facets e.g. by a factor of 2 to 20. In the illumination situation according to FIG. 3, the x-extent of the individual mirror partial beams 24 is smaller than the x-extent of the field facet 22 by approximately a factor of 10. In the illumination situation according to FIG. 5, the x-extent of the individual mirror partial beams 25 is smaller than the x-extent of the field facets 22 by approximately a factor of 3. In the illumination situation according to FIG. 13, the x-extent of the individual mirror partial beams 31 is smaller than the x-extent of the field facets 22 approximately by a factor of 8.

Figure 7:
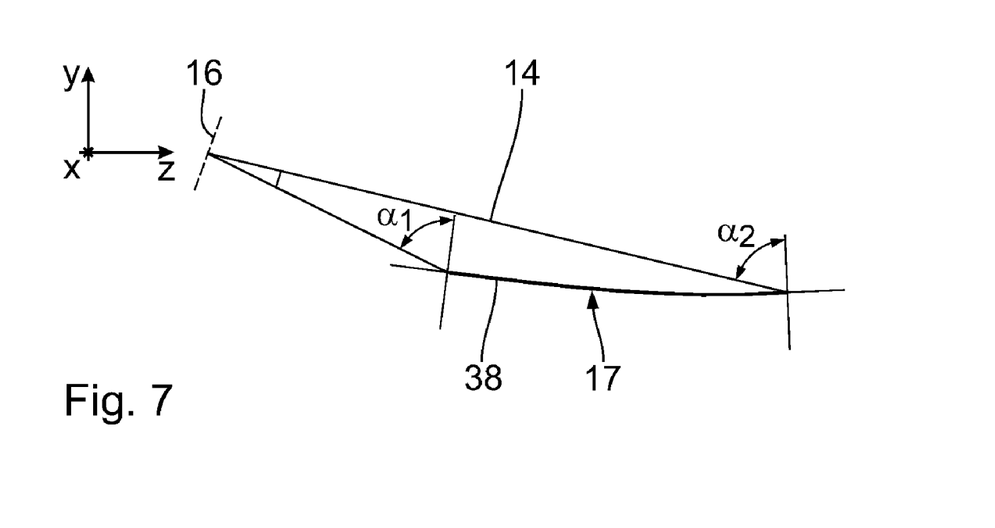
FIG. 7 shows details of illumination of the individual mirror array with an EUV radiation beam.

FIG. 7 illustrates an angle of incidence distribution of the EUV radiation beam 14 on the individual mirror array 17. The illustration shows the EUV radiation beam 14 starting from an intermediate focus in the intermediate focal plane 16 as far as impingement on the individual mirror array 17. The individual mirrors (not illustrated individually) of the individual mirror array 17 in the arrangement according to FIG. 7 are illuminated at an angle of incidence that is greater than 70° and can be 85°, for example. In the arrangement according to FIG. 7, the individual mirrors 18 are fitted on a curved baseplate 38 of the individual mirror array 17 such that, in a neutral position of the individual mirrors 18, all the individual mirrors 18 are illuminated with an angle of incidence that is identical within a tolerance range. In this case, the neutral position of each of the individual mirrors 18 is a force-free position of the associated actuator 19. In the neutral position of the individual mirrors 18, a curved overall surface of the individual mirror array 17 can be realized, as illustrated in FIG. 7, but a planar base surface of the individual mirror array 17 can also be realized in the neutral position of the individual mirrors 18. The tolerance range can be +/−1° for example.

FIG. 7 illustrates the two angles $\alpha_1$ and $\alpha_2$ of incidence firstly of that individual mirror 18 of the individual mirror array 17 which is arranged furthest on the left in FIG. 7, and secondly of that individual mirror of the individual mirror array 17 which is arranged furthest on the right in FIG. 7. To a good approximation, $\alpha_1=\alpha_2=85°$ holds true.

Figure 8:
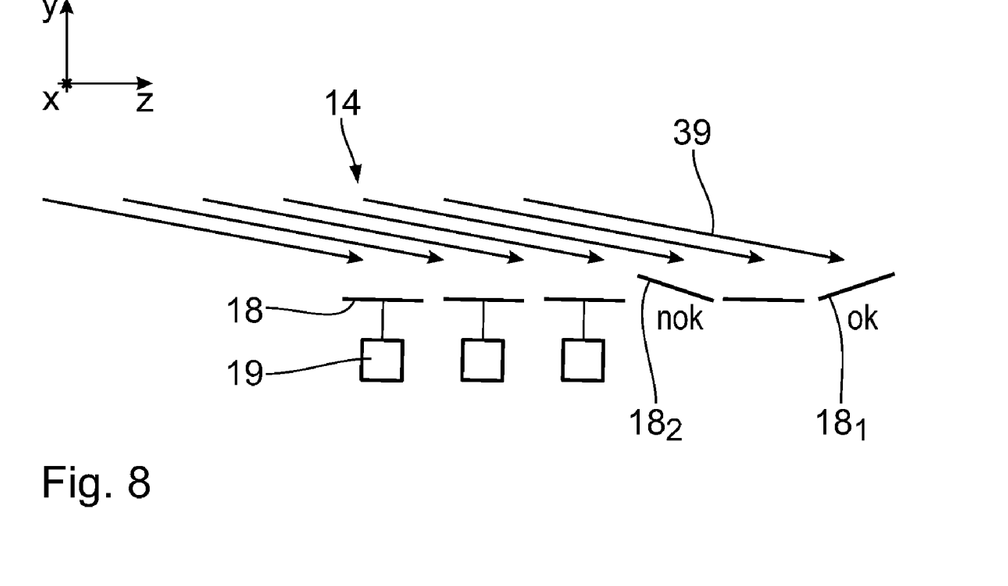
FIG. 8 shows an excerpt from the individual mirror array with a total of six individual mirrors, to which EUV rays are applied.

FIG. 8 illustrates a preferred direction of tilting of the individual mirrors 18 of the individual mirror array 17. Proceeding from an initial position of reflection surfaces of the individual mirrors 18 which lies approximately in the xz plane, tilting is effected on account of the grazing incidence by rays 39 of the EUV radiation beam 14 about a tilting axis, parallel to the x-axis, in FIG. 8 preferably in the anticlockwise direction. FIG. 8 illustrates this on the basis of two of the individual mirrors 18: the individual mirror $18_1$ on the far right in FIG. 8 is tilted by approximately 10° relative to the initial position, which is assumed for example by the three individual mirrors 18 illustrated on the left in FIG. 8, in the anticlockwise direction about a tilting axis parallel to the x-axis. In its tilting position, the individual mirror $18_1$ is readily reached by the rays 39. The individual mirror $18_2$ illustrated as the third mirror from the right in FIG. 8 is tilted proceeding from the neutral position by a corresponding absolute value of the angle about a tilting axis parallel to the x-axis in the clockwise direction. It becomes clear that, on account of the grazing incidence, such a tilting angle does not lead to a desired reflection of the rays 39, such that in practice the individual mirrors 18 are not tilted in the clockwise direction in the illustration according to FIG. 8.

Figures 9, 10, 11:
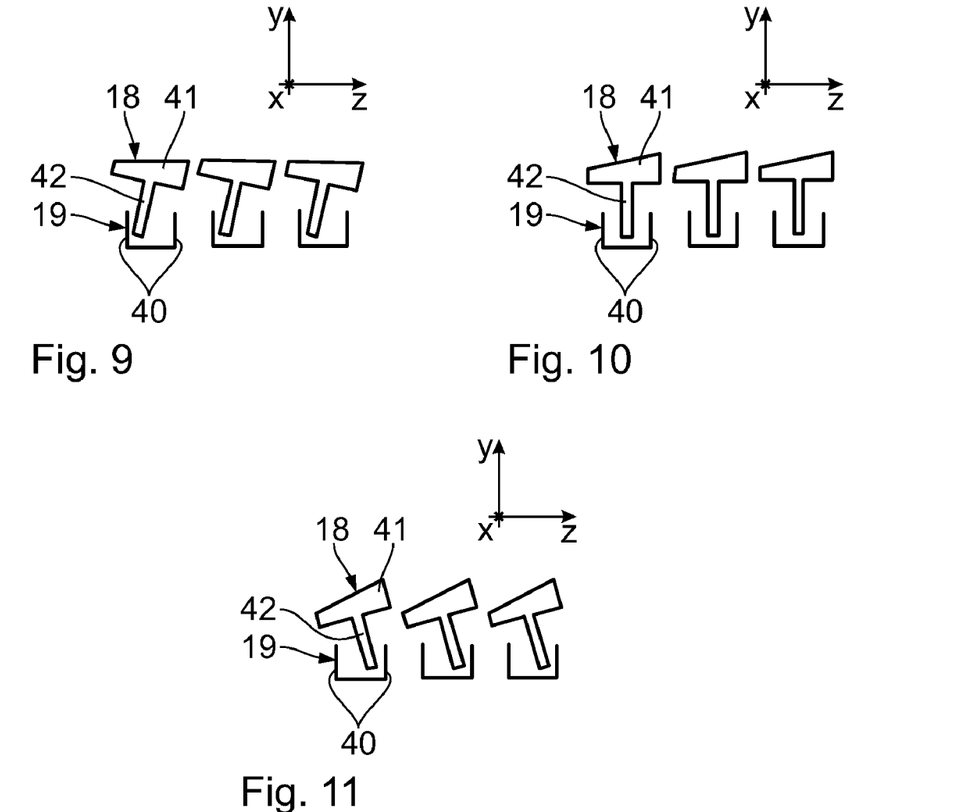
FIGS. 9 to 11 each show an excerpt from the individual mirror array with three individual mirrors, illustrated in a different tilting position in each case.

FIGS. 9 to 11 show a group of in each case three of the individual mirrors 18 with associated actuators 19. The actuators 19 are embodied as electrostatic actuators each having a pair of stationary electrodes 40 and an electrode pin 42 fixedly connected to a mirror body 41 of the individual mirror 18. FIG. 9 shows the three individual mirrors 18 in the neutral position that is likewise assumed for example by the three left-hand individual mirrors 18 in FIG. 8. In said neutral position, the individual mirror 18 lies in the region of one of the limits of the tilting range that can be attained using the actuator 19. In the neutral position, the electrode pin 42 is closest adjacent to the electrode 40 on the left in FIG. 9.

A curved base surface of the individual mirror array 17 can be realized by the arrangement of the individual mirrors 18 on a curved baseplate 38 (cf. FIG. 7), or can, using the respective tilting of the individual mirrors 18, if appropriate, also be realized when the individual mirror array 17 is constructed with a planar baseplate. Furthermore, a curved surface of the individual mirror array 17 can be realized in the case of maximum tilting of the individual mirrors 18. In the latter case, the reflection surfaces of the individual mirrors 18 can already intrinsically exhibit tilting.

FIG. 10 shows a voltage-free situation of the actuator 19. In this case, the electrode pin 42 lies centrally between the two electrodes 40 of the respective actuator 19. In this position, the reflection surfaces of the individual mirrors 18 have an angle with respect to the xz plane of approximately 5°.

FIG. 11 shows that position of the respective actuators 19 in which the electrode pin 42 of the actuator 19 is in each case closest adjacent to the electrode 40 illustrated on the right in FIG. 11. In this position, the reflection surfaces of the individual mirrors 18 have an angle with respect to the xz plane of 10°.

Figure 12:
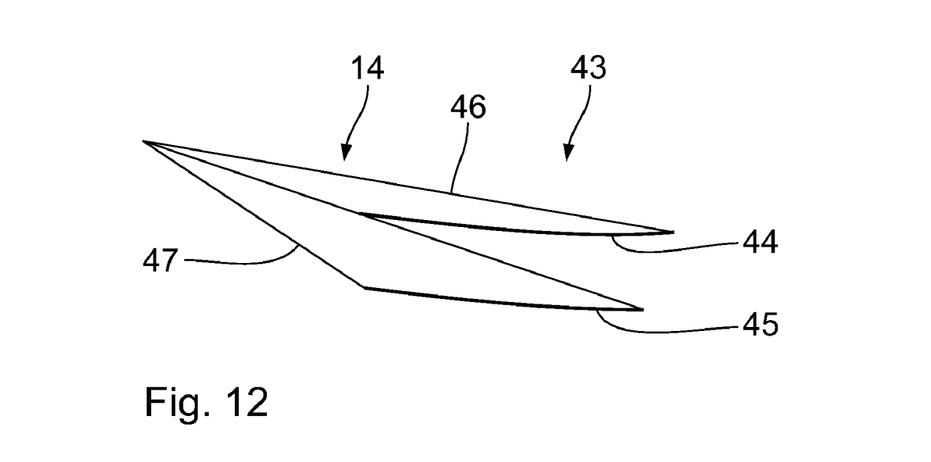
FIG. 12 shows, in an illustration similar to FIG. 7, a further embodiment of an individual mirror array, subdivided into a plurality of separate array sections.

FIG. 12 shows an alternative configuration of an individual mirror array 43 that can be used instead of the individual mirror array 17 of the embodiments described above. The individual mirror array 43 is described below only where it differs from the individual mirror array 17. The individual mirror array 43 is subdivided into a plurality of array sections, into two array sections 44, 45 in the embodiment illustrated. Each of the array sections 44, like the individual mirror array 17, is constructed from a multiplicity of individual mirrors arranged in rows and columns in a grid-like manner. The two array sections 44, 45 are arranged such that they are respectively illuminated with an illumination partial beam 46, 47 of the total EUV radiation beam 14. In this way, even EUV radiation beams 14 with a relatively high numerical aperture can be passed on completely by the individual mirror array 43. The array sections 44, 45 of the individual mirror array 43 can be constructed as ring shells, as are known in terms of the basic form from so-called nested collectors for collectors which are used instead of the collector 15. The typical Wolter geometries of such nested mirror constructions can be used.

This predetermination of the intensity distribution or of the intensity profile in the x-direction of the object field 5 can be used to correct a uniformity of the object field illumination without loss of light. It is also possible to predetermine illumination angle distributions dependent on the respective field location in the x-direction, that is to say on the respective field height, in a targeted manner.

The field facets of the field facet mirror can be arranged in non-continuous regions, between which interspaces are present. Such an embodiment of the field facet mirror is not illustrated in the drawing. The interspaces can be present, for example, where the illumination light is shaded at the location of the field facet mirror.

Those field facets 22 which image the individual mirrors 18 of the individual mirror array 17 onto specific, continuous pupil facet regions can, for their part, be arranged in continuous field facet regions. This is explained in greater detail below with reference to FIGS. 15 and 16. Components corresponding to those which have already been explained above with reference to FIGS. 1 to 14 bear the same reference numerals and will not be discussed in detail again.

Figure 15:
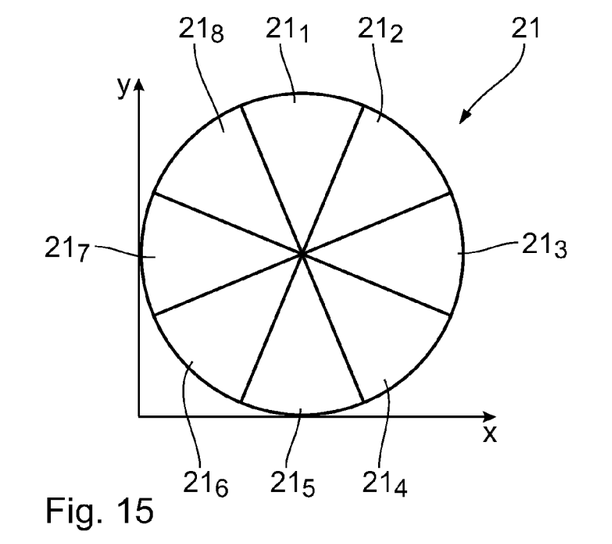
FIG. 15 shows schematically a plan view of a pupil facet mirror with a subdivision into continuous pupil facet regions.

FIG. 15 shows a plan view of an embodiment of the pupil facet mirror 21 subdivided into a total of eight sector-shaped, continuous pupil facet regions $21_1$ to $21_8$. In addition, the individual pupil facet regions $21_1$ to $21_8$ can also be subdivided radially as well, which is not illustrated in FIG. 15. The pupil facet regions $21_x$ are numbered consecutively with the index x rising in the clockwise direction in FIG. 15, beginning with the topmost pupil facet region $21_1$ there. By illuminating the complete sectors $21_1$, $21_5$, it is possible to realize e.g. an illumination setting in the form of a y-dipole. Complete illumination of the pupil facet regions $21_3$, $21_7$ correspondingly results in an x-dipole illumination setting.

A plurality or a multiplicity of the individual pupil facets 23 are in each case present within the pupil facet regions $21_1$ to $21_8$. This is not illustrated in schematic FIG. 15.

Figure 16:
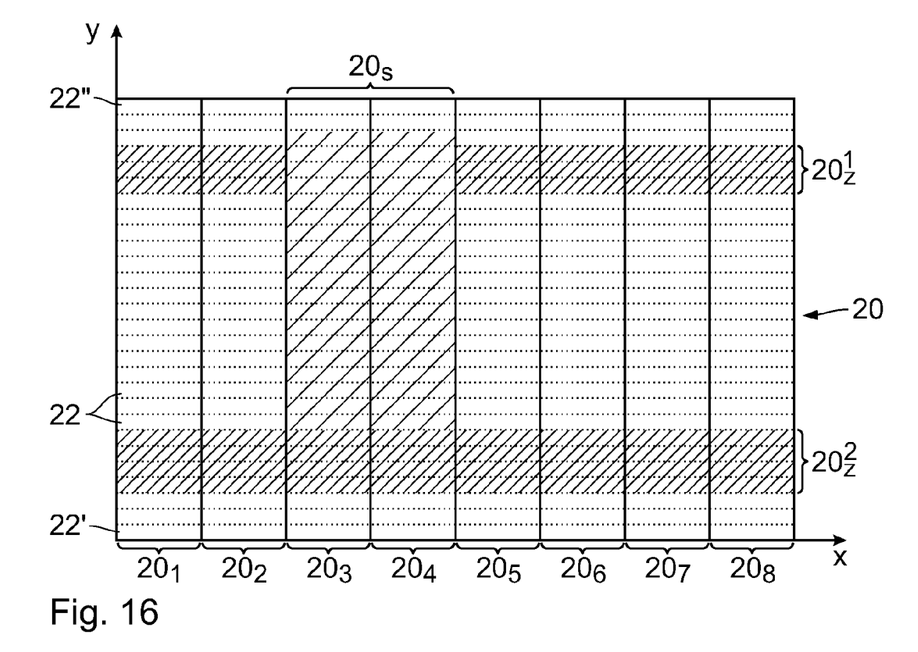
FIG. 16 shows schematically a plan view of a field facet mirror with, assigned to the pupil facet regions of the pupil facet mirror according to FIG. 15, field facets arranged in continuous field facet regions.

FIG. 16 likewise shows a plan view of an embodiment of the field facet mirror 20 having field facets 22 arranged in rows and columns. Overall, the field facet mirror 20 in the exemplary illustration according to FIG. 16 has eight columns each having 28 field facets 22, that is to say a total of 224 field facets 22. Each of the eight columns represents a continuous field facet region $20_1$ to $20_8$. In FIG. 16, these field facet regions $20_x$ are provided with a rising index x column by column from left to right.

The assignment of the field facet regions $20_1$ to $20_8$ to the pupil facet regions $21_1$ to $21_8$ is such that the field facet region $20_i$ respectively images individual mirrors 18 of the individual mirror array 17 onto the pupil facet region $21_i$.

A row position of the respective field facet 22, that is to say the position of the field facet 22 in the y-direction according to FIG. 16, is a measure of the radial position of the assigned pupil facet 23 of the pupil facet region $21_i$ assigned to the field facet region $20_i$. In the embodiment according to FIGS. 15 and 16, this assignment is such that the field facets 22 with rising y-values within a field facet region $20_i$ illuminate ever larger radii within the sector-shaped pupil facet region $21_i$. A field facet 22' assigned to the smallest y-value in the field facet region $22_1$ (cf. FIG. 16) accordingly illuminates a pupil facet 23 which lies in the pupil facet region $21_1$ near the centre of the pupil facet mirror 21, that is to say at minimum radius around the centre. A field facet 22" assigned to the largest y-value in the field facet region $20_1$ correspondingly illuminates a pupil facet 23 lying in the pupil facet region $21_1$ radially right in the outer portion.

By way of example, annular illumination settings can also be realized with the chosen assignment of the field facet regions $20_1$ to the pupil facet regions $21_i$. This is illustrated in the facet row regions $20_2{}^1$ and $20_2{}^2$ highlighted by hatching in FIG. 16. If all the field facets 22 within the field facet row region $20_z{}^1$ illuminated, this results in an annular illumination in a radially outer region of all the pupil facet regions $21_1$ to $21_8$ and a corresponding annular illumination setting with a relatively large illumination angle. If the row field facet region $20_2{}^2$ is illuminated over all the field facet regions $20_1$ to $20_8$, this results in illumination of all the pupil facet regions $21_1$ to $21_8$ in a radially inner region and correspondingly an annular illumination setting with a relatively small illumination angle.

If, by way of example, the field facet regions $20_1$ and $20_5$ are illuminated, this results in an illumination of the pupil facet regions $21_1$, $21_5$ and thus the x-dipole illumination setting already discussed above. By way of example, FIG. 16 illustrates an illumination—indicated by hatching lines spaced apart further from one another in comparison with the two field facet row regions $20_2{}^1$, $20_2{}^2$—of a field facet column region $20_s$ including a large portion of the field facet regions $20_3$, $20_4$. An illumination of the field facet column region $20_s$ would lead to an illumination of the pupil facet regions $21_3$ and $21_4$ that is to say to a pupil illumination with a centroid in quadrant IV of the pupil facet mirror 21.

By correspondingly combining field facets 22 from the field facet regions $20_1$ to $20_8$ it is also possible to realize other illumination settings, for example multipole illumination settings or conventional illumination settings with a predetermined maximum illumination angle. The field facet regions $20_1$ to $20_8$ are also designated as macroblocks.

Generally, in the assignment of the field facet regions $20_i$ to the pupil facet regions $21_i$, it holds true that an arrangement is chosen in which the field facets 22 lying alongside one another within one of the field facet regions $22_i$ are assigned to pupil facets 23 also lying as close together as possible. An assignment of field facets 22 lying alongside one another to pupil facets 23 arranged centrosymmetrically is also possible. Generally, in the assignment of the field facet regions $20_i$ to the pupil facet regions $21_i$, which are respectively also designated as microblocks, it holds true that the position and/or the arrangement of the facet regions have/has to be taken into consideration if the illumination optical unit 4 is optimized with regard to its system efficiency or with regard to its reflection efficiency.

During projection exposure, the reticle 7 and the wafer 12 bearing a coating that is light-sensitive to the EUV radiation beam 14 are provided. Afterwards, at least one section of the reticle 7 is projected onto the wafer 12 with the aid of the projection exposure apparatus 1. Finally, the light-sensitive layer exposed by the EUV radiation beam 14 on the wafer 12 is developed. The micro- or nanostructured component, for example a semiconductor, is produced in this way.

Other embodiments are in the following claims.

What is claimed is:

1. An illumination optical unit for projection lithography, configured for illuminating an object arranged in an object field with illumination light, the illumination optical unit comprising:
   a field facet mirror comprising a plurality of field facets;
   a pupil facet mirror comprising a plurality of pupil facets, wherein the pupil facets image into the object field the field facets that are respectively assigned individually to the pupil facets; and
   an individual mirror array having individual mirrors that can be individually tilted in driven fashion, said array being arranged in an illumination light beam path upstream of the field facet mirror.

2. The illumination optical unit of claim 1, wherein a group of a plurality of the individual mirrors is imaged onto one of the pupil facets.

3. The illumination optical unit of claim 1, wherein a group of a plurality of the individual mirrors is imaged onto a plurality of pupil facets by the tilting of at least some of the individual mirrors of the group.

4. The illumination optical unit of claim 1, wherein individual mirror partial beams of specific individual mirrors overlap on the field facet mirror.

5. The illumination optical unit of claim 1, wherein groups of a plurality of the individual mirrors overlap one another on the individual mirror array such that specific individual mirrors belong to a plurality of groups simultaneously such that the specific individual mirrors can be imaged onto a plurality of pupil facets.

6. The illumination optical unit of claim 1, wherein the field facets have an aspect ratio of greater than one, where the aspect ratio is the ratio between a long facet side and a short facet side, and individual mirror partial beams of specific individual mirrors have on the field facet mirror an extent along the short facet side that is larger than the short facet side.

7. The illumination optical unit of claim 1, wherein the field facets have an aspect ratio of greater than one, where the aspect ratio is the ratio between a long facet side and a short facet side, and individual mirror partial beams of specific individual mirrors have on the field facet mirror an extent along the long facet side that is smaller than the long facet side.

8. The illumination optical unit of claim 1, wherein the individual mirrors are illuminated at an angle ($\alpha$) of incidence that is greater than 65°.

9. The illumination optical unit of claim 1, wherein the individual mirrors are fitted on a curved baseplate through the individual mirror array in such a way that, in a neutral position of the individual mirrors, all of the individual mirrors are illuminated with an angle ($\alpha$) of incidence that is identical within a tolerance range.

10. The illumination optical unit of claim 9, wherein the individual mirrors have a drivable tilting range, wherein a tilting actuator of one of the individual mirrors in each case is arranged so that the entire tilting range is attained by electrostatic attractive force between electrodes of the tilting actuator, wherein the individual mirror, in the neutral position, lies in the region of one of the edges of the electrostatically attainable tilting range.

11. The illumination optical unit of claim 1, wherein the individual mirror array is subdivided into a plurality of mutually separate sections arranged such that they can be illuminated with part of an entire radiation beam.

12. The illumination optical unit of claim 1, wherein the field facets which image individual mirrors of the individual mirror array onto specific, continuous pupil facet regions are arranged in continuous field facet regions.

13. An illumination system, comprising:
an illumination optical unit according to claim 12; and
a projection optical unit for imaging the object field into an image field, in which a wafer to be exposed can be arranged.

14. A projection exposure apparatus, comprising:
an illumination system according to claim 13; and
a radiation source for the radiation beam.

15. A method for producing patterned components comprising the following steps:
providing a wafer to which a layer composed of a light-sensitive material is at least partly applied;
providing a reticle comprising structures to be imaged;
providing a projection exposure apparatus according to claim 14; and
projecting at least part of the reticle onto a region of the layer of the wafer using the projection exposure apparatus.

* * * * *

UNITED STATES PATENT AND TRADEMARK OFFICE
CERTIFICATE OF CORRECTION

PATENT NO. : 8,294,877 B2
APPLICATION NO. : 13/368430
DATED : October 23, 2012
INVENTOR(S) : Johannes Wangler, Markus Deguenther and Stig Bieling It is certified that error appears in the above-identified patent and that said Letters Patent is hereby corrected as shown below:

Column 8, Line 60, delete "$18_I$," insert --$18_{II}$--;

Column 9, Line 56, delete "$18_I$," insert --$18_1$--;

Column 9, Line 61, delete "$18_I$," insert --$18_1$--;

Column 11, Line 39, delete "20," insert --$20_i$--;

Column 11, Line 47, delete "20," insert --$20_i$--;

Column 11, Line 60, delete "$20_2^1$ and $20_2^2$" insert --$20_z^1$ and $20_z^2$--;

Column 11, Line 62, delete "$20_z^1$" insert --$20_z^1$ are--;

Column 11, Line 66, delete "$20_2^2$" insert --$20_z^2$--;

Column 12, Line 10, delete "$20_2^1$, $20_2^2$" insert --$20_z^1$, $20_z^2$--; and Column 12, Line 23, delete "20," insert --$20_i$--.

Signed and Sealed this
Fifteenth Day of January, 2013

David J. Kappos
*Director of the United States Patent and Trademark Office*